United States Patent
Chan et al.

(10) Patent No.: US 7,105,420 B1
(45) Date of Patent: Sep. 12, 2006

(54) METHOD TO FABRICATE HORIZONTAL AIR COLUMNS UNDERNEATH METAL INDUCTOR

(75) Inventors: Lap Chan, San Francisco, CA (US); Kok Wai Johnny Chew, Singapore (SG); Cher Liang Cha, Singapore (SG); Chee Tee Chua, Singapore (SG)

(73) Assignees: Chartered Semiconductor Manufacturing Ltd., Singapore (SG); National University of Singapore, Singapore (SG)

( * ) Notice: Subject to any disclaimer, the term of this patent is extended or adjusted under 35 U.S.C. 154(b) by 0 days.

(21) Appl. No.: 09/413,177

(22) Filed: Oct. 7, 1999

(51) Int. Cl.
*H01L 21/76* (2006.01)

(52) U.S. Cl. ............ 438/422; 438/421; 438/311; 257/E21.581

(58) Field of Classification Search ........ 438/422, 438/421, 619, 214, 280, 319, 318, 411, 412; 257/522
See application file for complete search history.

(56) References Cited

U.S. PATENT DOCUMENTS

| | | | | |
|---|---|---|---|---|
| 4,671,852 A | * | 6/1987 | Pyke | 156/652 |
| 5,000,818 A | * | 3/1991 | Thomas et al. | 156/643 |
| 5,171,713 A | * | 12/1992 | Matthews | 438/31 |
| 5,413,962 A | * | 5/1995 | Lur et al. | 438/619 |
| 5,481,131 A | * | 1/1996 | Staudinger et al. | 257/531 |
| 5,539,241 A | * | 7/1996 | Abidi et al. | 257/531 |
| 5,668,398 A | * | 9/1997 | Havemann et al. | 257/522 |
| 5,828,121 A | | 10/1998 | Lur et al. | 257/522 |
| 5,844,299 A | | 12/1998 | Merrill et al. | 257/531 |
| 5,880,018 A | | 3/1999 | Boeck et al. | 438/619 |
| 5,880,026 A | | 3/1999 | Xing et al. | 438/688 |
| 5,936,295 A | * | 8/1999 | Havemann et al. | 257/522 |
| 6,037,248 A | * | 3/2000 | Ahn | 438/619 |
| 6,140,197 A | * | 10/2000 | Chu et al. | 438/381 |

FOREIGN PATENT DOCUMENTS

GB      2238671 A   *   11/1989

\* cited by examiner

*Primary Examiner*—N. Drew Richards
(74) *Attorney, Agent, or Firm*—Saile Ackerman LLC; Stephen B. Ackerman

(57) ABSTRACT

A new method is provided for creating an inductor on the surface of a silicon substrate. The invention provides overlying layers of oxide fins beneath a metal inductor. The oxide fins provide the stability support for the overlying metal inductor while also allowing horizontal air columns to simultaneously exist underneath the inductor. Overlying layers of air cavities that are spatially inserted between the created overlying layers of oxide fins can be created under the invention by repetitive application of the mask used. The presence of the air wells on the surface of the substrate significantly reduces parasitic capacitances and series resistance of the inductor associated with the substrate.

19 Claims, 5 Drawing Sheets

METHOD TO FABRICATE HORIZONTAL AIR COLUMNS UNDERNEATH METAL INDUCTOR

BACKGROUND OF THE INVENTION (1) Field of the Invention

The invention relates to the fabrication of integrated circuit devices, and more particularly, to a method of forming air gaps under metal RF inductors that are used in the integration of RF Integrated Circuits on silicon substrates.

(2) Description of the Prior Art

In the fabrication of semiconductor devices, these devices can typically perform functions of digital data manipulation and data storage. In addition, these devices can also be used to serve as Radio Frequency (RF) amplifiers. Conventional RF amplifiers use a tuned circuit that consists of inductive and capacitive components. This tuned circuit can be used as a filter to filter out or remove signals of certain frequencies or to remove noise from a circuit configuration. The tuned circuit can also be used to form a high electrical impedance by using the LC resonance of the circuit and to thereby counteract the effect of parasitic capacitances that form part of a circuit. There are a number of significant advantages in integrating on one semiconductor monolithic substrate the functions of data manipulation and data storage with the indicated functions that are typically performed by a RF amplifier. For instance, manufacturing costs can be significantly reduced while power consumption for the combined functions is also limited. Inductors however typically are of significant size and therefore require a significant area of the semiconductor device to be implemented. The inductors are typically formed on the surface of a substrate in a spiral form. The physical size of the inductor that is created in this manner however makes the appearance of a significant amount of parasitic capacitances unavoidable. These parasitic capacitances exist between the inductor wiring and the underlying substrate. These parasitic capacitances have a serious negative effect on the functionality of the created LC circuit by sharply reducing the frequency of resonance of this circuit.

It is, as previously stated, desirable to be able to create the required inductance on the same monolithic substrate on which additional semiconductor devices are created (in order to realize the advantages that have been stated above). The parasitic capacitances that occur as part of this creation however limit the quality factor of the inductor that can be achieved using the conventional silicon process to about 10. This limitation is, for many applications, not acceptable. Dependent on the frequency at which the LC is designed to resonate, significantly larger values of quality factor, of for instance 100 or more, must be available. Prior Art has in this been limited to creating values of higher quality factor as separate units and integrating these separate units with the surrounding device functions. This negates the advantages that can be obtained when using the monolithic construction of creating both the inductor and the surrounding devices on one and the same semiconductor substrate. The non-monolithic approach also has the disadvantage that additional wiring is required to interconnect the sub-components of the assembly thereby again introducing additional parasitic capacitances and resistive losses over the interconnecting wiring network. For many of the applications of the RF amplifier, such as portable battery powered applications, power consumption is at a premium and must therefore be as low as possible. By raising the power consumption, the effects of parasitic capacitances and resistive power loss can be partially compensated but there are limitations to even this approach. These problems take on even greater urgency with the rapid expansion of wireless applications such as portable telephones and the like. Wireless communications is a rapidly expanding market where the integration of RF integrated circuits is one of the most important challenges. One of the approaches is to significantly increase the frequency of operation to for instance the range of 10 to 100 GHz. For such high frequencies, the values of the quality factor obtained from silicon-based inductors are significantly degraded. For applications in this frequency range, monolithic inductors have been researched using other than silicon as the base for the creation of the inductors. Such monolithic inductors have for instance been created using sapphire or GaAs as a base. These inductors have a considerably lower parasitic capacitance than their silicon counterparts and therefore provide higher frequencies of resonance of the LC circuit. Where however more complex applications are required, the need still exists to create inductors using silicon as a substrate. For those applications, the approach of using a base material other than silicon has proven to be too cumbersome while for instance GaAs as a medium for the creation of semiconductor devices is as yet a technical challenge that needs to be addressed.

The incorporation of RF inductors without sacrificing device performance due to substrate losses has been extensively researched in recent years. Some of the techniques that have been used for this approach include:

the selective removing (by etching) of the silicon underneath the inductor (using methods of micro-machining)
using multiple layers of metal (such as aluminum) interconnects or of copper damascene interconnects
using a high resistivity silicon substrate
employing biased wells underneath a spiral conductor
inserting various types of patterned ground shields between the spiral inductor and the silicon substrate
increasing the thickness of the inter-layer dielectric.

The above listing of researched alternatives is not meant to be complete or all inconclusive. All of the above approaches have as common objectives to:

1) enhance the quality (O) value of the inductor, and
2) increase the frequency of the LC self-resonance thereby increasing the frequency range over which the inductor can be used.

The quality factor Q of an inductor can be described as follows: Q=Es/El wherein Es is the energy that is stored in the reactive portion of the component while El is the energy that is lost in the reactive portion of the component. The better the quality of the component, the closer the resistive value of the component approaches zero while the Q factor of the component approaches infinity. The quality factor for components differs from the quality that is associated with filters or resonators. For components, the quality factor serves as a measure of the purity of the reactance (or the susceptance) of the component which can be degraded due to parasitics. In an actual configuration, there are always some physical resistors that will dissipate power thereby decreasing the power that can be recovered. The quality factor Q is dimensionless. A Q value of greater than 100 is considered very high for discrete inductors that are mounted on the surface of Printed Circuit Boards. For inductors that form part of an integrated circuit, the Q value is typically in the range between about 3 and 10.

As has previously been stated, the self-resonance that is caused by the parasitic capacitance between the (spiral) inductor and the underlying substrate will limit the use of the inductor at high frequencies. Furthermore, the series spreading resistance associated with the substrate will degrade the Q factor of the inductor. This than has a direct effect on the usefulness of a monolithic or integrated inductor that is implemented on silicon substrates. This effect can be overcome if the area underneath the inductor can be made to appear locally insulating by selectively removing the underlying silicon resulting in inductors that are suspended in air. Air, having the lowest dielectric constant, forms an ideal barrier. The lowest possible and therefore the ideal dielectric constant is 1.0. This is the dielectric constant of a vacuum whereas air has a dielectric constant of slightly larger than 1.0.

The invention provides oxide fins beneath the metal inductor. The oxide fins provide the stability support for the overlying metal while also allowing horizontal air columns to simultaneously exist underneath the inductor. More than two air columns can be created by the technique presented in this invention by repetitive application of the mask used. The presence of the air wells on the surface of the substrate significantly reduces parasitic capacitances and series resistance associated with the substrate.

U.S. Pat. No. 5,828,121 (Lur et al.) shows air gaps between metal lines at different levels by etching the dielectric layers between the metal line levels. This is close to the invention.

U.S. Pat. No. 5,539,241 (Abidi et al.) and U.S. Pat. No. 5,844,299 (Merrill et al.) show air gaps under inductors.

U.S. Pat. No. 5,880,026 (Xing et al.) shows a process to form air gaps between conductors.

U.S. Pat. No. 5,880,018 (Boeck et al.) shows another air gap process between lines.

SUMMARY OF THE INVENTION

A principle objective of the invention is to provide a method of creating a high quality inductor on the surface of a silicon semiconductor substrate.

Another objective of the invention is to reduce parasitic capacitances associated with an inductor that is created on the surface of a silicon substrate.

Another objective of the invention is to reduce series resistance associated with the silicon substrate upon which the inductor is built.

A still further objective of the invention is to increase the value of the self-resonant frequency of an inductor-capacitor circuit that is created on the surface of a silicon substrate thereby increasing the usable frequency range of the inductor.

A still further objective of the invention is to decrease the real part of the impedance at resonance of an inductor-capacitor circuit that is created on the surface of a silicon substrate thereby increasing the quality value of the inductor.

In accordance with the objectives of the invention a new method is provided for creating an inductor on the surface of a silicon substrate. The invention provides overlying layers of oxide fins beneath a metal inductor. The oxide fins provide the stability support for the overlying metal inductor while allowing horizontal air columns to simultaneously exist underneath the inductor. Overlying layers of air cavities that are spatially inserted between the created overlying layers of oxide fins can be created under the invention by repetitive application of the mask used. The presence of the air wells on the surface of the substrate significantly reduces parasitic capacitances and series resistance associated with the substrate.

DESCRIPTION OF THE PREFERRED EMBODIMENTS

Figure 1:
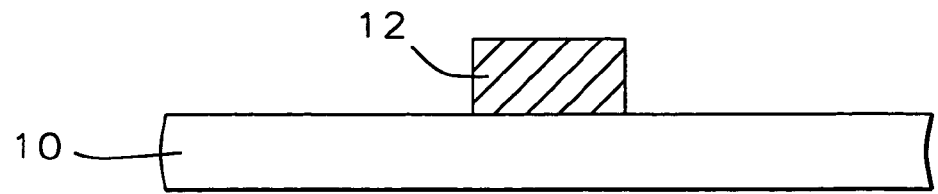
FIG. 1 shows a cross section of a layer of dielectric on the surface of which has been created a metal layer.

Referring now specifically to FIG. 1, there is shown a cross section of a layer 10 of either Inter Level Dielectric (ILD) or Inter Metal Dielectric (IMD) that forms a surface in the creation of a semiconductor device. The layer 10 can be deposited directly on the surface of a silicon substrate or it can be created as an overlying layer within the creation of a semiconductor device. Layer 10 can exist at any level within the creation of a semiconductor device.

Layer 10 can contain any suitable dielectric such as for instance silicon dioxide ("oxide", doped or undoped) or silicon nitride ("nitride"), silicon oxynitride, fluoropolymer, parylene, poyimide, tetra-ethyl-ortho-silicate (TEOS) based oxides, boro-phosphate-silicate-glass (BPSG), phospho-silicate-glass (PSG), boro-silicate-glass (BSG), oxide-nitride-oxide (ONO), plasma enhanced silicon nitride (PSiNx), oxynitride, a low dielectric constant material, such as hydrogen silsesquioxane and HDP-FSG (high-density-plasma fluorine-doped silicate glass.

The most commonly used and therefore the preferred dielectrics are silicon dioxide (doped or undoped), silicon oxynitride, parylene or polyimide, spin-on-glass, plasma oxide or LPCVD oxide.

The deposition of the layer 10 of dielectric uses conventional deposition technology and can, for instance, be deposited using LPCVD, PECVD, or APCVD procedures at a temperature of between about 400 and 800 degrees C. to a thickness between about 5000 and 10000 Angstrom using TEOS as a source.

The metal layer 12 preferably has vertical sidewalls and can be composed of aluminum, tungsten, titanium copper polysilicon, polycide or alloys of these metal. Layer 12 preferably has a thickness of between about 3000 and 10,000 Angstrom and more preferably 4000 Angstrom. The layer 12 preferably has a width in the range between about 4000 and 8000 Angstrom and more preferably about 5000 Angstrom. A preferred process to form the metal layer 12 is a Ti/TiN/AlCu/TiN process.

The method used for forming the metal pattern 12 uses conventional deposition and planarization techniques. Standard photolithographic and RIE procedures, using $Cl_2$—$BCl_3$ as etchant, can be used to form the metal structure 12.

Figure 2:
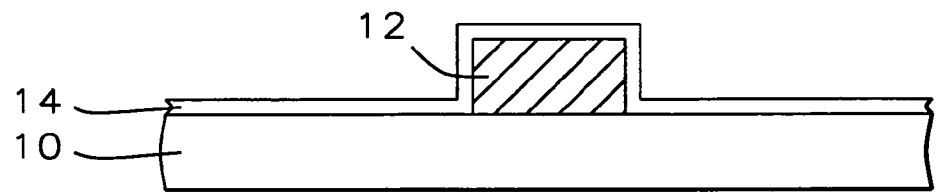
FIG. 2 shows a cross section after the deposition of a layer of oxide liner.

FIG. 2 shows a cross section after a thin layer 14 of oxide has been deposited over the surface of the dielectric layer 10. The function of layer 14 is to serve as stress relieve layer between the underlying layer 10 of dielectric and the overlying structure of the invention. Layer 14 can be deposited using PECVD at a temperature between about 350 and 450 degrees C. to a thickness between about 50 and 250 angstrom. Other materials that can be considered for layer 14 can contain materials such as TEOS (tetraethosiloxane), Plasma Enhanced TEOS (PETEOS), boron phosphate silicate glass (BPSG), borosilicate glass (BSG), phosphosilicate glass (PSG) or any other material that has the properties of a dielectric. Layer 14 is preferably formed by a plasma enhanced CVD deposition process.

Figure 3:
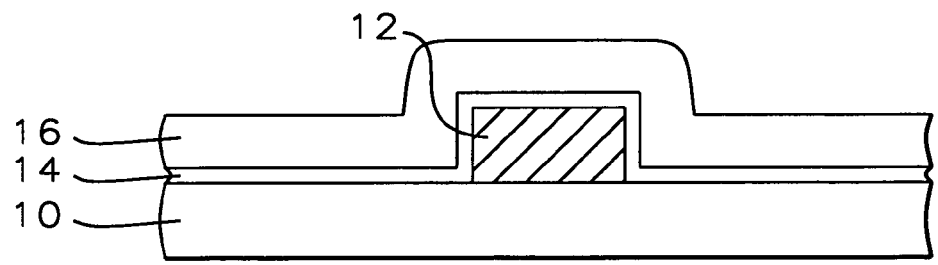
FIG. 3 shows a cross section after the deposition of a first layer of nitride.

FIG. 3 is a cross section after the layer 16 of nitride has been deposited over the surface of the layer 14 of oxide. Nitride is frequently used in the art as a structural dielectric layer. The layer 16 of nitride can be deposited using PECVD procedures at a pressure between about 200 mTorr and 2 Torr, at a temperature between about 350 and 450 degrees C., to a thickness between about 1000 and 5000 Angstrom using $NH_3$ and $SiH_4$.

Figure 4:
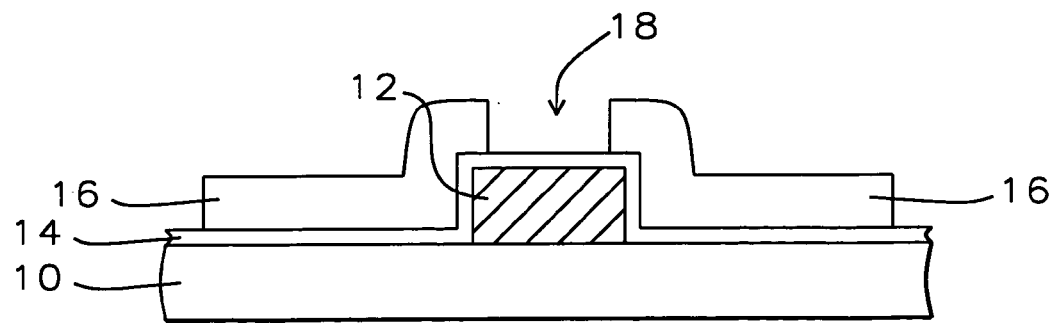
FIG. 4 shows a cross section after the creation of an opening in the first layer of nitride.

FIG. 4 shows a cross section after an opening has been etched in the first layer 16 of nitride. The opening 18 can be anisotropically etched with a plasma gas containing fluorcarbon gasses such as $CF_4/CHF_3$ chemistry or $Co/C_4F_8$ chemistry, in a commercial RIE etcher or an electron cyclotron resonance (ECR) plasma reactor. Nitride layer 16 can also be etched using hot $H_3PO_4$ as an etchant.

Figure 5:
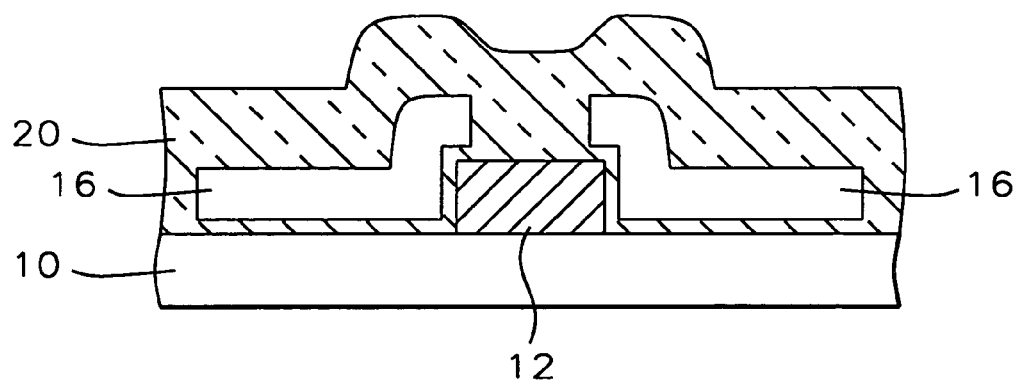
FIG. 5 shows a cross section after the deposition of a first layer of oxide.

FIG. 5 shows a cross section after a first layer 20 of oxide has been deposited over the surface of layer 16 of nitride thereby including the inside of opening 18. The method of deposition of layer 20 can use conventional PECVD deposition at a temperature between about 350 and 450 degrees C. and a pressure between about 200 mTorr and 2 Torr, deposited to a thickness between about 5000 and 10,000 Angstrom. The layer 20 of oxide can also be deposited using APCVD, LPCVD or PECVD processing at a temperature between about 350 and 450 degrees C.

Figure 6:
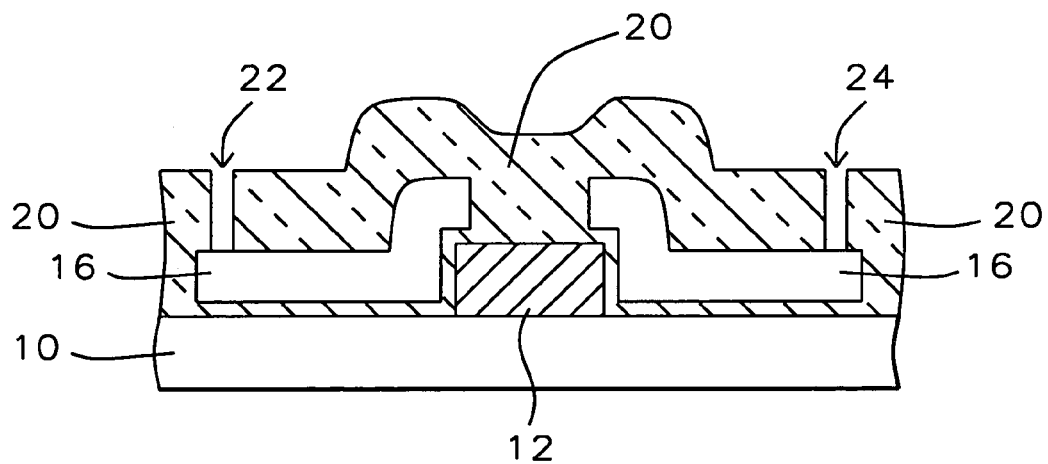
FIG. 6 shows a cross section after the creation of openings in the first layer of oxide.

FIG. 6 shows a cross section after openings 22 and 24 have been etched through the first layer of oxide 20. It is to be noted that these openings penetrate the layer 20 of first oxide down to the surface of the first layer 16 of nitride. These openings will, during following steps of the process of the invention, be filled with nitride forming columns of nitride that support the overlying structure of the invention. Standard photolithography and RIE procedures, using $CF_4/CHF_3$ as etchants, are used to create the openings 22 and 24.

Figure 7:
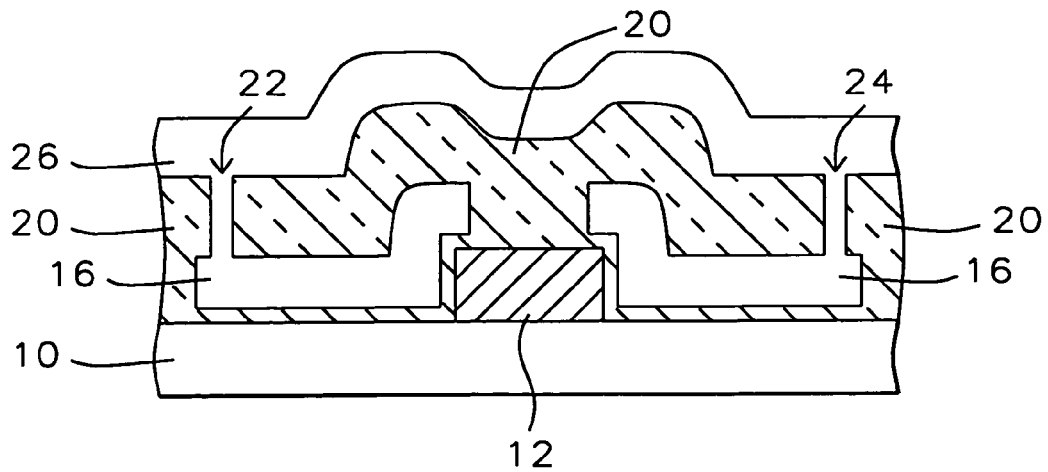
FIG. 7 shows a cross section after the deposition of a second layer of nitride.

FIG. 7 shows a cross section after a second layer 26 of nitride has been deposited over the surface of the first oxide layer 20 thereby also filling openings 22 and 24 with nitride. The layer 26 of nitride can be deposited using PECVD procedures at a pressure between about 200 mTorr and 2 Torr, at a temperature between about 350 and 450 degrees C., to a thickness between about 1000 and 5000 Angstrom.

Figure 8:
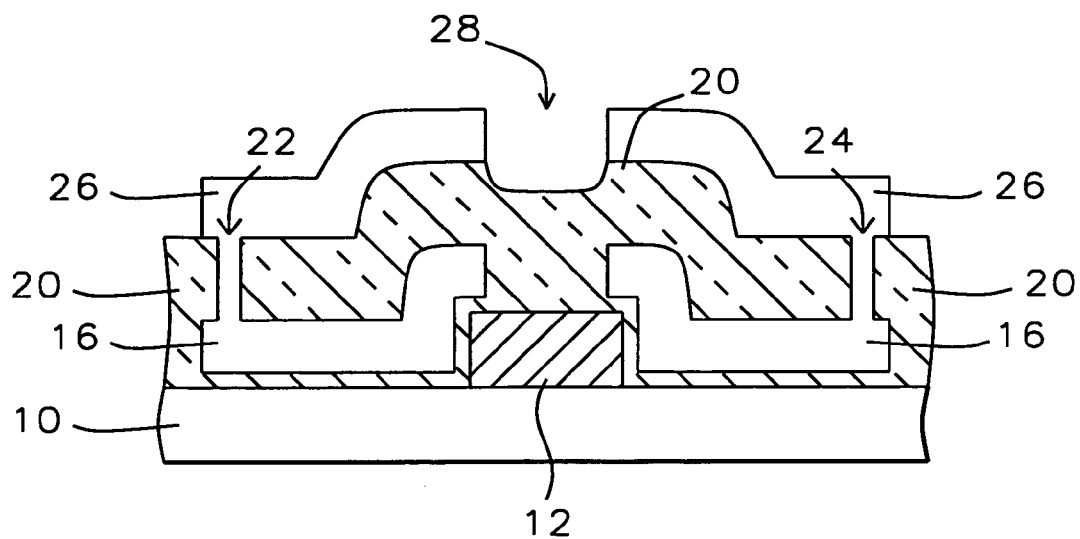
FIG. 8 shows a cross section after the creation of an opening in the second layer of nitride.

FIG. 8 shows a cross section after the layer 26 of nitride has been etched thereby forming opening 28 in the layer 26 of nitride. It must be noted that the opening is aligned with the opening 18 (FIG. 4) which has been aligned with the metal pattern 12. The opening 28 can be anisotropically etched with a plasma gas containing $CF_4/CHF_3$, in a commercial RIE etcher or an electron cyclotron resonance (ECR) plasma reactor.

Figure 9:
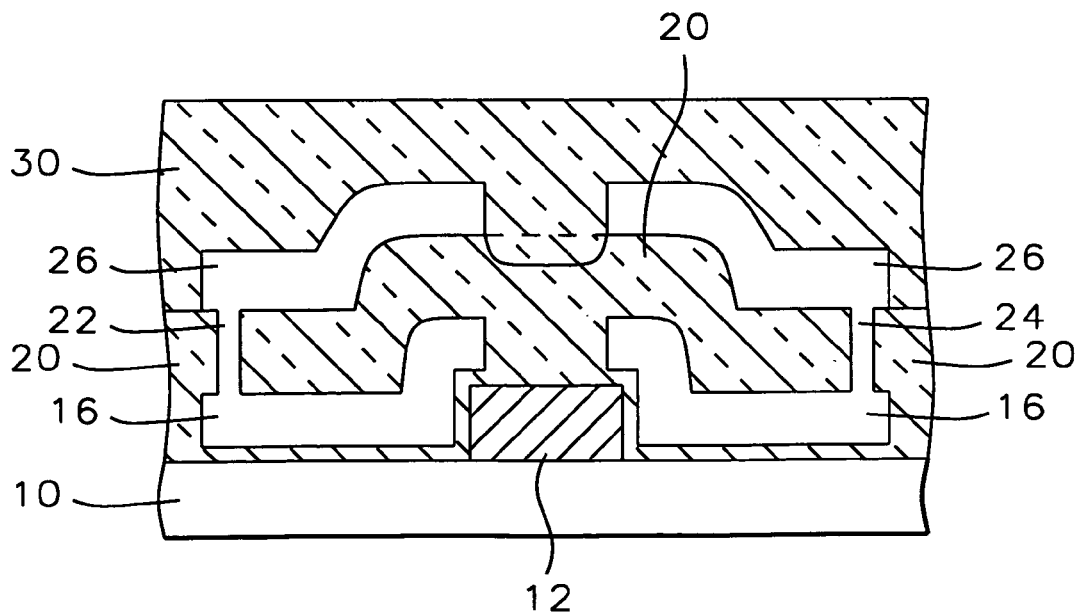
FIG. 9 shows a cross section after the deposition of a second layer of oxide.

FIG. 9 shows a cross section after the second layer 30 of oxide has been deposited over the surface of the second layer 26 of nitride thereby filling the opening 28 (FIG. 8). The method and processing conditions that are applied for the deposition of layer 30 are the same as previously detailed for the deposition of the first layer 20 of oxide, FIG. 5. These parameters will therefore not be further discussed at this point. If required, CMP will be used to planarize layer 30.

Figure 10:
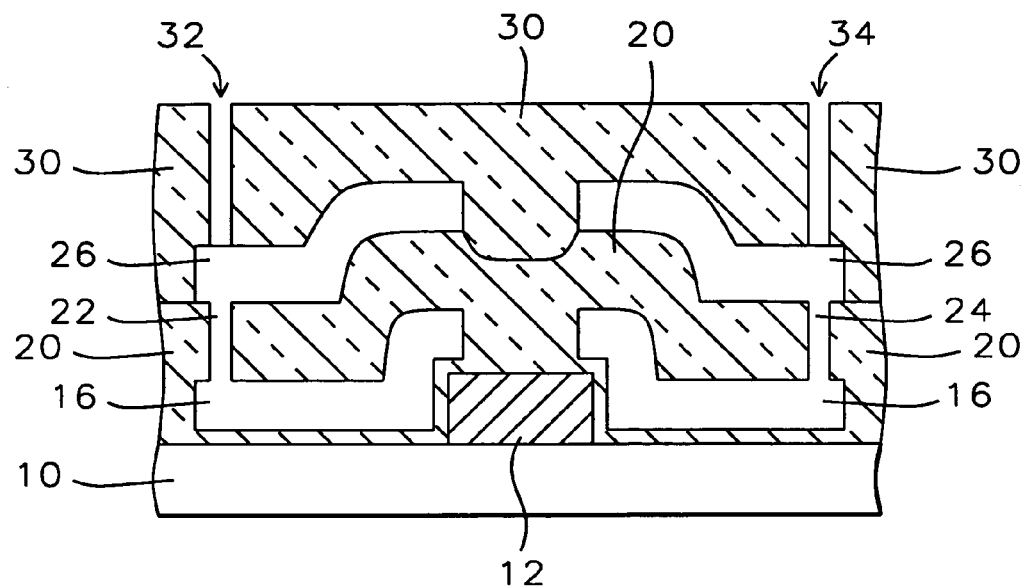
FIG. 10 shows a cross section after the creation of openings in the second layer of oxide.

FIG. 10 shows a cross section after the second layer 30 of oxide has been etched thereby creating the openings 32 and 34. The parameters and operating conditions that are applied for this etch are the same as have previously detailed for the etch of openings 22 and 24, FIG. 6. These parameters therefore need not further be discussed at this point. It must be noted that openings 32 and 34 align with openings 22 and 24 (FIG. 6) that have previously been created in the first layer 20 of oxide. It must further be noted that the layers of nitride of the first layer 16 and the second layer 26 are accessible by means of the openings 32 and 34.

Figure 11:
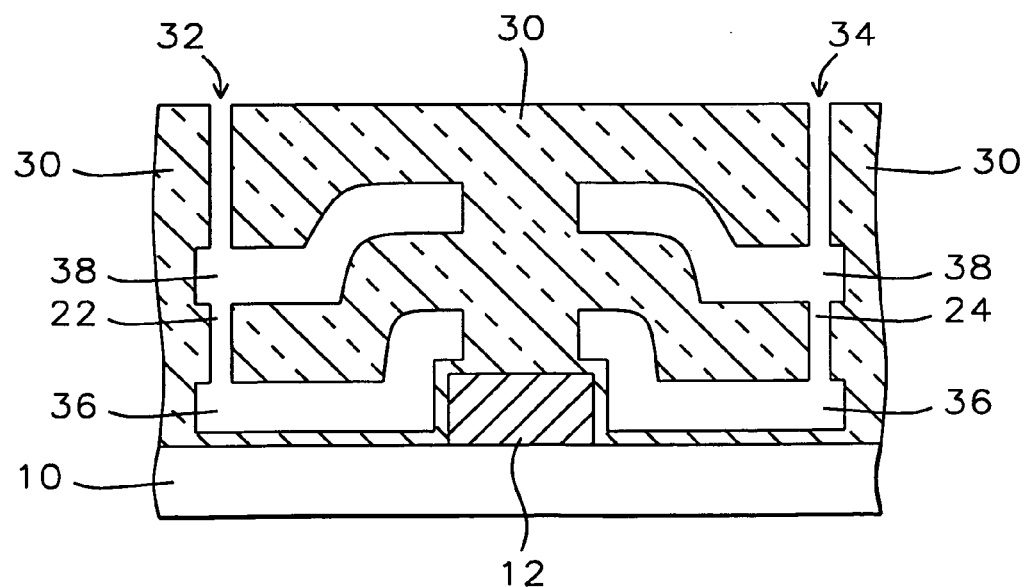
FIG. 11 shows a cross section after the removal of the layers of nitride.

FIG. 11 shows a cross section after the nitride of the first layer 16 and the nitride of the second layer 26 have been removed from the structure. The structure is dipped into hot phosphoric acid ($H_3PO_4$) in order for the nitride to be removed (wet nitride removal). The removal of the nitride of the first layer 16 of nitride creates the air gaps 36; the removal of the nitride of the second layer 26 of nitride creates the air gaps 38. The air gaps 36 and 38 are interconnected via openings 22 and 24 while air gaps 38 are, at this time, connected to the surface of the structure via openings 32 and 34.

Figure 12:
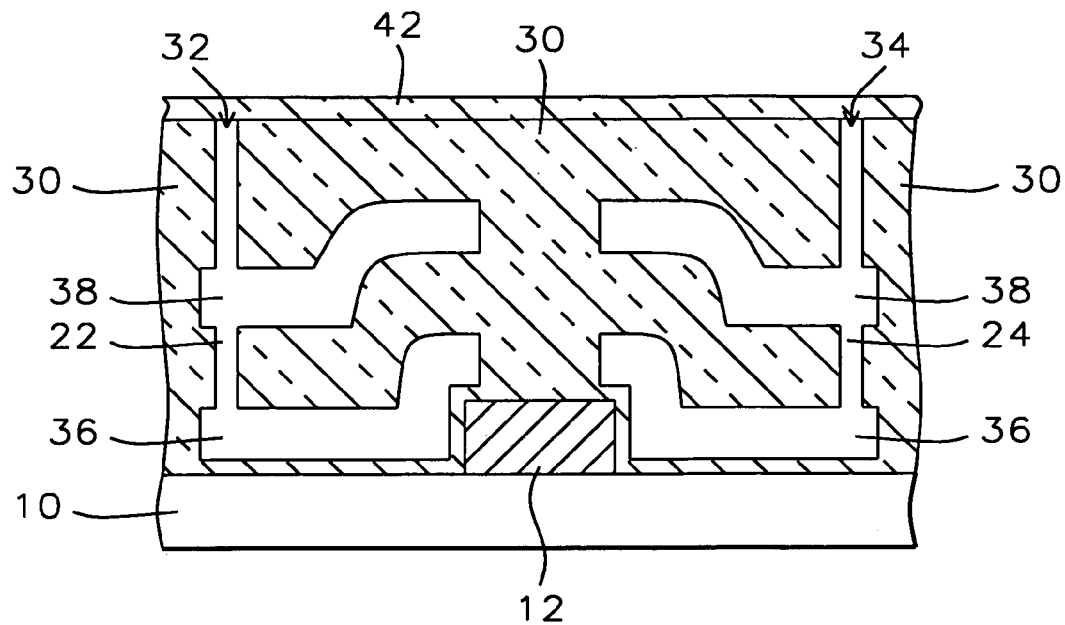
FIG. 12 shows a cross section after the deposition of a thin layer of CVD oxide.

FIG. 12 shows a cross section after a thin layer 42 of oxide is deposited over the surface of the structure. This thin layer of oxide is required to close the openings 32 and 34 thereby making the structure a self contained and complete structure and thereby furthermore enclosing the air gaps 36 and 38. Methods and techniques that can be used to deposit this thin layer 42 of oxide have previously been detailed and do therefore not need to be discussed any further at this point. The thickness of the thin oxide layer 42 is to be optimized such that adequate surface tension can be created such that the oxide of this layer 42 does not penetrate into openings 32 and 34 or into the air gaps 36 and 38 that have been created by the removal of the first and second layer of nitride.

Figure 13:
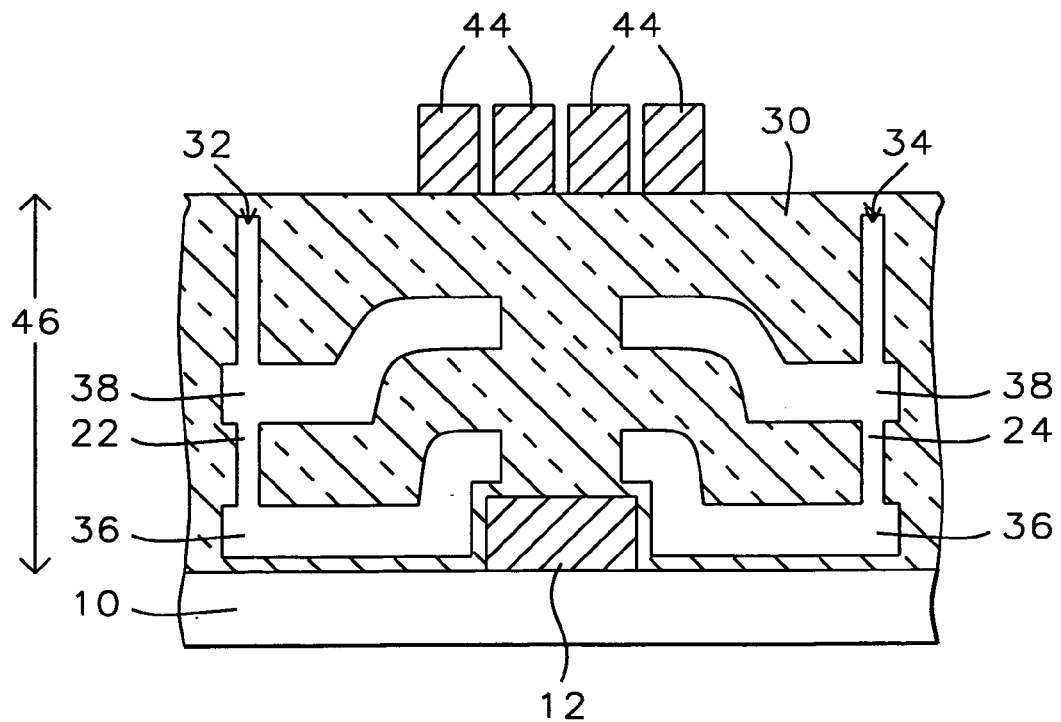
FIG. 13 shows a cross section after the patterning and creation of the top metal of the inductor over the surface of the CVD oxide.

FIG. 13 shows a cross section of the structure after the inductor 44 has been formed on the surface of the thin layer 42 of oxide. Conventional methods can be used for the creation of the inductor; the previously indicated Ti/TiN/AlCu/TiN process is also the preferred method to form the inductor. Layer 12 of the structure serves as the electrical point of reference (zero point or ground) or the inner port for the inductor 44. Electrically conductive materials that can be used for the inductor 44 include but are not limited to Al, Ti, Ta, W, Mo, Cu, polysilicon or a combination of these materials.

The parameter 46, which is the total thickness of the construction of the invention that has been discussed up to this point, can be controlled in order to control the parasitic capacitance of the inductor 44 with respect to the underlying layer 10 of ILD/IMD. By increasing the value of 46, the dielectric constant of the created structure decreases, which results in a decrease of the parasitic capacitance. This increase of the value of 46 can be accomplished by increasing the thickness of the layer 42 (FIG. 12) of deposited oxide or by increasing the number of cavities (identical to cavities 36 and 38) that are created as part of the structure. The increased number of cavities can be created using the same masks that have been used for the creation of cavities 36 and 38. The structure that is shown in FIG. 13 contains two levels of cavities, that is cavities 36 and 38. The invention is not limited to two levels of cavities but can, by continuation of the processing steps that have been highlighted for the creation of the two cavities, be extended to additional cavities. The total number of cavities of the structure is determined by the functional requirements that are imposed on the creation of the inductor 44 in accordance with the design considerations that have previously been indicated.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. A method of forming air gaps within an integrated circuit structure, therewith forming a high quality inductor over a semiconductor substrate, comprising the steps of:
    providing a semiconductor substrate with a partially fabricated integrated circuit structure having been created thereon and depositing a layer of dielectric over the semiconductor substrate;
    forming a metal layer on said dielectric layer;
    depositing a first thin layer of oxide over said dielectric layer, thereby including said metal layer;
    forming a structure for first cavities over said first thin layer of oxide and aligned with said metal layer, said forming a structure for first cavities comprising applying and patterning a first layer of disposable solid followed by applying and patterning a first layer of oxide, said patterning a first layer of oxide further comprising forming a first and a second opening through said first layer of oxide, said first and second openings providing access to said first layer of disposable solid;
    forming a structure for second cavities above and aligned with said structure for said first cavities, said forming a structure for second cavities comprising applying and patterning a second layer of disposable solid followed by applying and patterning a second layer of oxide, said patterning a second layer of oxide further comprising forming a third and fourth opening through said second layer of oxide, said third and fourth openings providing access to said second layer of disposable solid, thereby creating overlying patterned first and second layers of disposable solid separated by said first layer of oxide and interconnected by said first and second opening formed through said first layer of oxide, said overlying patterned first and second layers of disposable solid being accessible via said third and fourth opening formed through said second layer of oxide;
    creating the first and the second cavities;
    performing an oxide deposition over said second cavities, creating a second thin layer of oxide; and
    forming a metal inductor on said second thin layer of oxide.

2. The method of claim 1, wherein said forming a metal layer on said dielectric layer is forming a patterned layer of interconnect metal.

3. The method of claim 1 wherein said forming the structure for first cavities comprises the steps of:
    said applying said first layer of disposable solid over said first thin layer of oxide;
    said patterning said first layer of disposable solid comprising creating an opening in said first layer of disposable solid, whereby said opening in said first layer of disposable solid aligns with said metal layer;
    said applying said first layer of oxide includes depositing said first layer of oxide in said opening in said first layer of disposable solid, whereby said first layer of oxide has a dimension of thickness in addition to having a dimension of width; and
    said patterning said first layer of oxide comprising creating a first and a second opening through said first layer of oxide, whereby said first and second openings through said first layer of oxide are located at opposite extremities of said first layer of oxide, whereby a distance between a center of said first and second openings through said first layer of oxide is less than said dimension of width of said first layer of oxide.

4. The method of claim 1 wherein said forming the structure for second cavities comprises the steps of:
    said applying said second layer of disposable solid includes depositing said second layer of disposable solid in said first and second openings created in said first layer of oxide;
    said patterning said second layer of disposable solid comprises creating an opening in said second layer of disposable solid, whereby said opening in said second layer of disposable solid aligns with said metal layer and has a dimension when measured in a direction along said first layer of oxide that is approximately equal to a dimension of the opening created in said first layer of disposable solid;
    said applying said second layer of oxide includes depositing said second layer of oxide in said opening created in said second layer of disposable solid, whereby said second layer of oxide has a dimension of thickness in addition to having a dimension of width; and
    said patterning said second layer of oxide comprising creating a third and fourth opening in said second layer of oxide, whereby said third and fourth openings in said second layer of oxide are located at opposite extremities of said second layer of oxide, whereby a distance between a center of said third and fourth openings in said second layer of oxide is less than said dimension of width of said second layer of oxide.

5. The method of claim 1, said creating a first and a second layer of cavities is removing said first and second layer of disposable solid, said removal to take place by accessing said second layer of disposable solid by said third and fourth opening in said second layer of oxide, furthermore by accessing said first layer of disposable solid by said first and second openings in said first layer of oxide, creating a first layer and a second layer of dielectric comprising horizontal oxide fins, further creating a first layer and a second layer of air gaps being interspersed with said first layer and a second layer of dielectric.

6. The method of claim 1 wherein said performing an oxide deposition over said second layer of cavities is creating a thin layer of oxide over said second layer of oxide, thereby furthermore closing said third and fourth openings created in said second layer of oxide.

7. The method of claim 1, creating additional layers of cavities over a preceding layer of cavities, said additional layers being created prior to performing an oxide deposition over an upper or last layer of cavities, said creation of additional layers of cavities comprising the steps of:

depositing an additional layer of disposable solid over a layer of oxide of a preceding layer of cavities, thereby including first and second openings created in said layer of oxide of a preceding layer of cavities;

creating an opening in said additional layer of disposable solid, said opening being aligned with said metal layer and having a dimension when measured in a direction along said layer of oxide of a preceding layer of cavities that is approximately equal to a dimension of an opening created in a preceding layer of disposable solid;

depositing an additional layer of oxide over said additional layer of disposable solid, thereby including said opening created in said additional layer of disposable solid, said additional layer of oxide having a dimension of thickness in addition to having a dimension of width; and creating a first and a second opening in said additional layer of oxide, said first and second openings being located at opposite extremes of said additional layer of oxide, a distance between a center of said first and second openings being less than said dimension of width of said additional layer of oxide, creating a first layer and a second layer of dielectric comprising horizontal oxide fins, further creating a first layer and a second layer of horizontal air gaps being interspersed with said first layer and a second layer of dielectric.

8. The method of claim 1 said first and second layers of disposable solid comprising a polymer.

9. The method of claim 8, said creating a first and a second layer of cavities is heating said substrate in oxygen, evaporating said disposable solid layer using $O_2$ plasma.

10. The method of claim 8, said creating a first and a second layer of cavities is introducing a solvent to said substrate, dissolving said polymer.

11. The method of claim 8 wherein creating a first and a second layer of cavities is heating said substrate, evaporating said polymer.

12. The method of claim 11 wherein creating a first and a second layer of cavities is applying a vacuum to said substrate, dissolving said polymer.

13. The method of claim 1 wherein an insulating layer is deposited over said inductor thereby encapsulating said inductor.

14. The method of claim 1, said partially fabricated integrated circuit structure comprising transistors being bipolar or CMOS devices interconnected to form an RF amplifier.

15. The method of claim 1, said inductor being a spiral.

16. The method of claim 15, said spiral of said inductor being circular or polygonal.

17. The method of claim 16, the polygonal inductor being a square or a hexagon or an octagon.

18. The method of claim 1, said inductor having an inductance in excess of 1 nH and a self-resonance in excess of 10 MHz.

19. The method of claim 1, said first layer of disposable solid and said second layer of disposable solid comprising nitride.

* * * * *